(12) United States Patent
Yamamoto et al.

(10) Patent No.: US 12,471,489 B2
(45) Date of Patent: Nov. 11, 2025

(54) MANUFACTURING METHOD OF DISPLAY DEVICE

(71) Applicant: Magnolia White Corporation, Tokyo (JP)

(72) Inventors: Yuya Yamamoto, Tokyo (JP); Nobuo Imai, Tokyo (JP); Hiroshi Ogawa, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 389 days.

(21) Appl. No.: 18/165,978

(22) Filed: Feb. 8, 2023

(65) Prior Publication Data

US 2023/0255097 A1 Aug. 10, 2023

(30) Foreign Application Priority Data

Feb. 8, 2022 (JP) .................................. 2022-018014

(51) Int. Cl.
*H10K 71/60* (2023.01)
*H10K 71/00* (2023.01)
*H10K 71/20* (2023.01)

(52) U.S. Cl.
CPC ........... *H10K 71/60* (2023.02); *H10K 71/231* (2023.02); *H10K 71/621* (2023.02)

(58) Field of Classification Search
None
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2019/0363275 A1 | 11/2019 | Ochi et al. |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

*Primary Examiner* — Anthony Ho
(74) *Attorney, Agent, or Firm* — XSENSUS LLP

(57) ABSTRACT

According to one embodiment, a manufacturing method of a display device includes providing a processing substrate in which a lower electrode is formed on a stage inside a chamber, forming a first insulating layer overlapping the lower electrode in a state where a first distance is formed between the stage and a counter-electrode, and subsequently forming a second insulating layer on the first insulating layer in a state where a second distance greater than the first distance is formed between the stage and the counter-electrode, forming a rib by patterning the first insulating layer and the second insulating layer, forming a partition, forming an organic layer, forming an upper electrode, forming a cap layer, and forming a sealing layer.

16 Claims, 19 Drawing Sheets

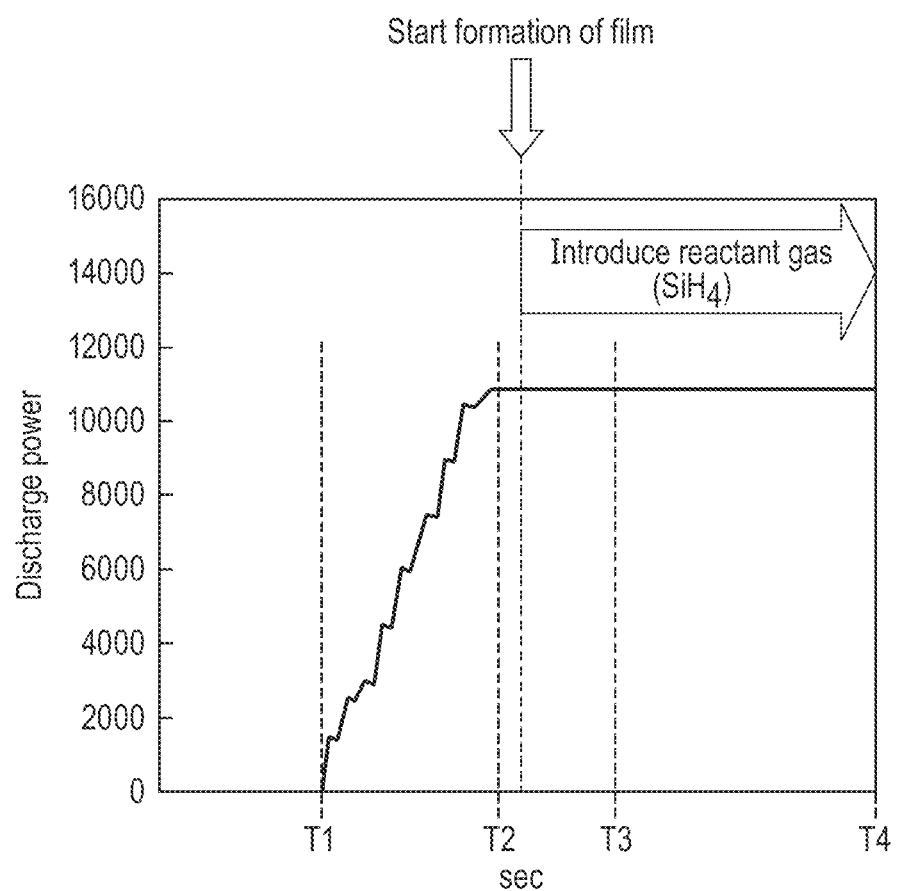
F I G. 12

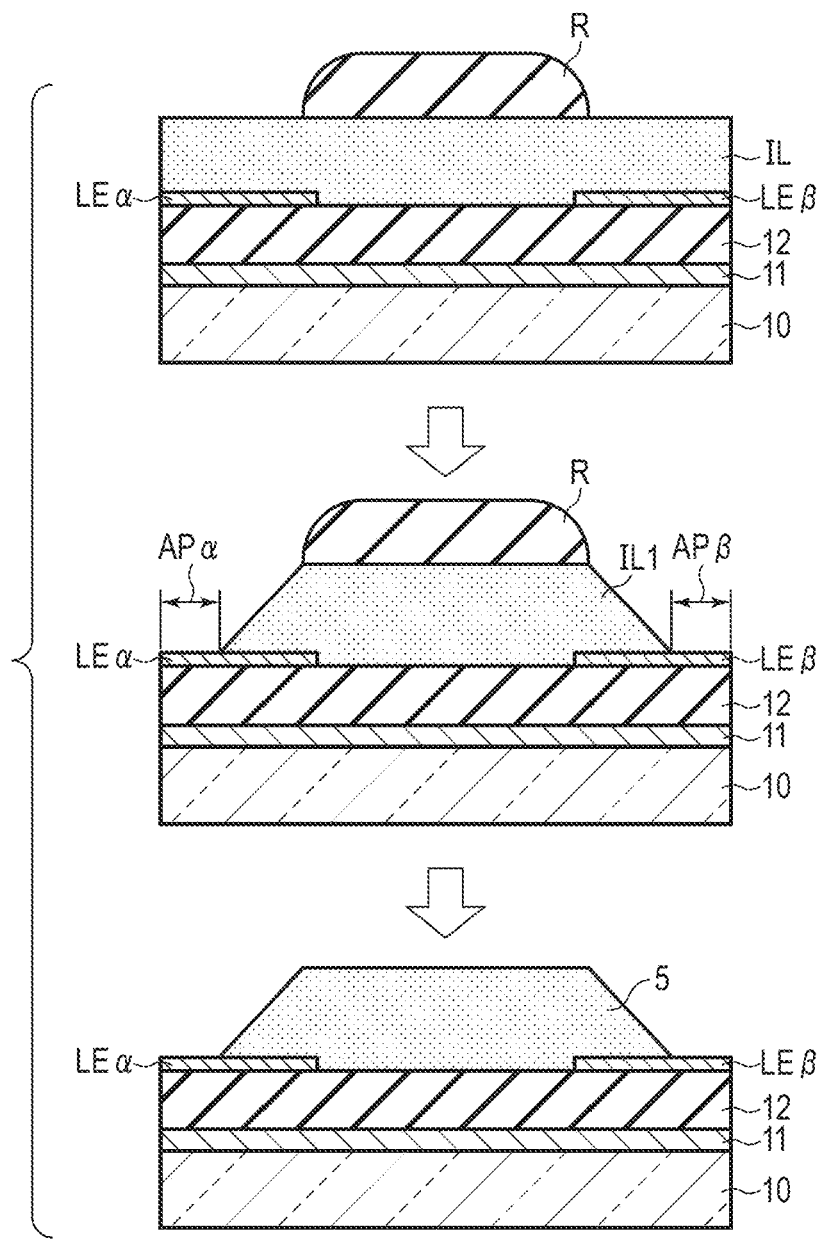
F I G. 14

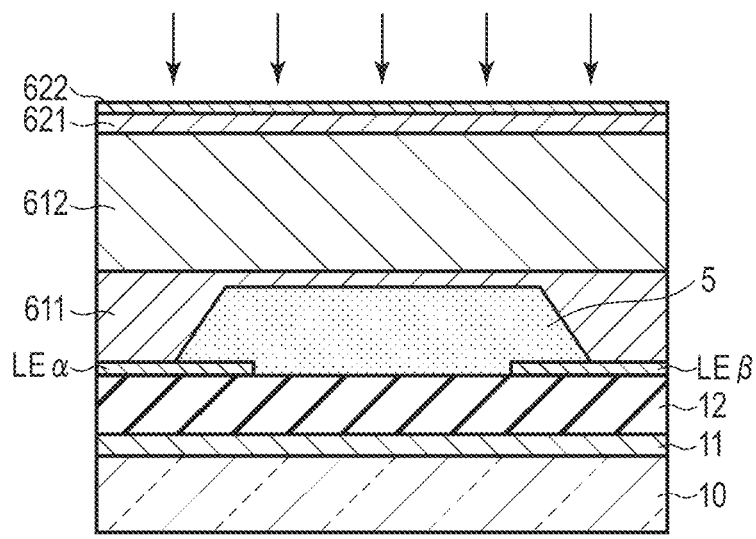
F I G. 15
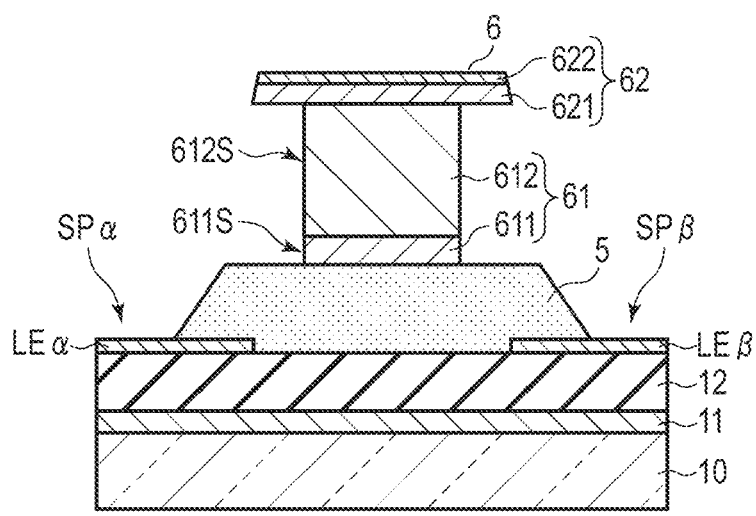
F I G. 16

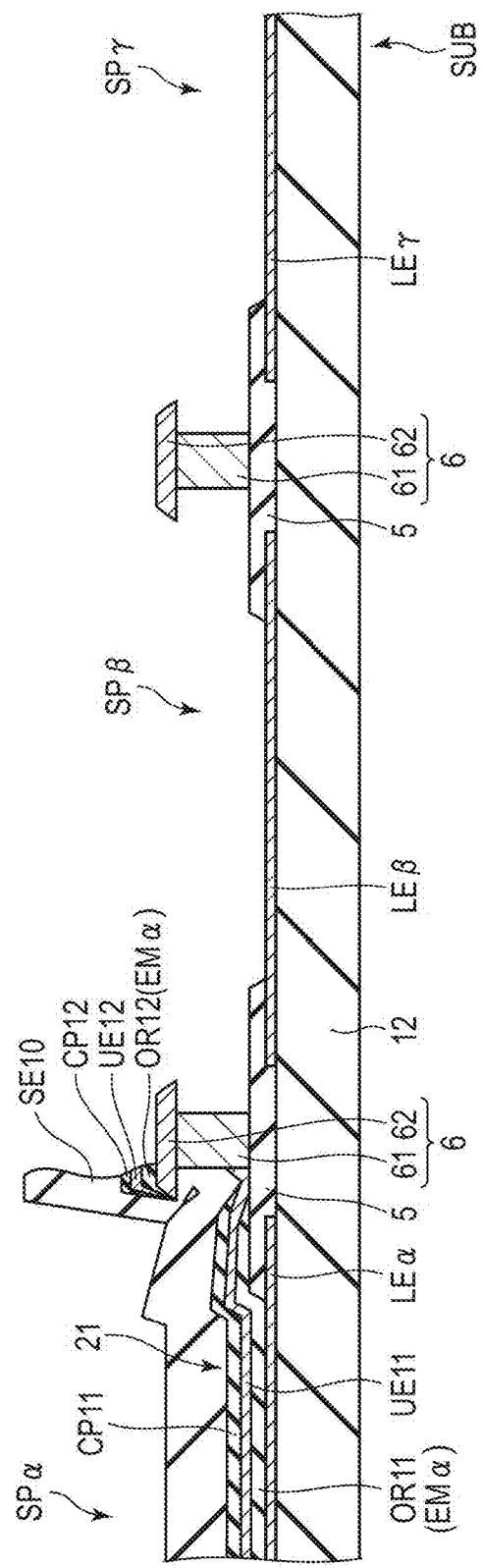
F I G. 22

MANUFACTURING METHOD OF DISPLAY DEVICE

CROSS-REFERENCE TO RELATED APPLICATIONS

This application is based upon and claims the benefit of priority from Japanese Patent Application No. 2022-018014, filed Feb. 8, 2022, the entire contents of which are incorporated herein by reference.

FIELD

Embodiments described herein relate generally to a manufacturing method of a display device.

BACKGROUND

Recently, display devices to which an organic light emitting diode (OLED) is applied as a display element have been put into practical use. This display element comprises a pixel circuit including a thin-film transistor, a lower electrode connected to the pixel circuit, an organic layer which covers the lower electrode, and an upper electrode which covers the organic layer. The organic layer includes functional layers such as a hole-transport layer and an electron-transport layer in addition to a light emitting layer.

In the process of manufacturing such a display element, a technique which prevents the reduction in reliability has been required.

BRIEF DESCRIPTION OF THE DRAWINGS

FIG. 12 is a diagram for explaining the relationship between the voltage application time and discharge power.

FIG. 14 is a diagram for explaining the process of preparing the processing substrate SUB.

FIG. 15 is a diagram for explaining the process of preparing the processing substrate SUB.

FIG. 16 is a diagram for explaining the process of preparing the processing substrate SUB.

FIG. 22 is a diagram for explaining the process of removing the resist 41.

DETAILED DESCRIPTION

Figure 1:
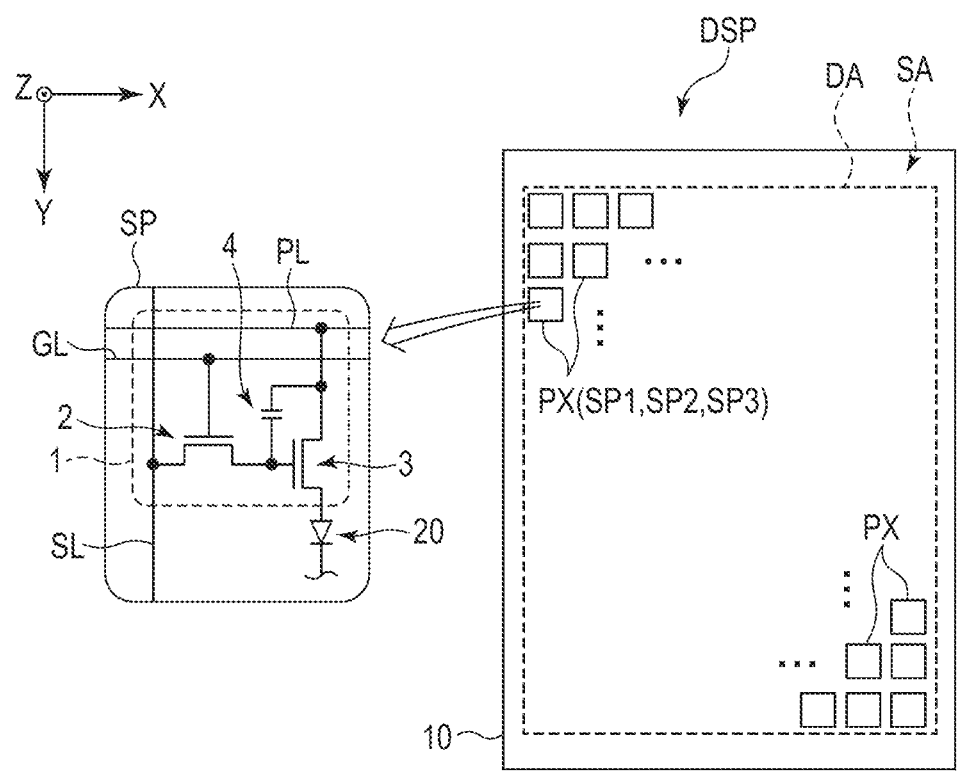
FIG. 1 is a diagram showing a configuration example of a display device DSP.

Embodiments described herein aim to provide a manufacturing method of a display device which can prevent the reduction in reliability.

In general, according to one embodiment, a manufacturing method of a display device comprises forming a lower electrode above a substrate, providing a processing substrate in which the lower electrode is formed on a stage inside a chamber, forming a first insulating layer overlapping the lower electrode in a state where a first distance is formed between the stage and a counter-electrode, and subsequently forming a second insulating layer on the first insulating layer in a state where a second distance greater than the first distance is formed between the stage and the counter-electrode, forming a rib comprising an aperture overlapping the lower electrode by patterning the first insulating layer and the second insulating layer, forming a partition comprising a lower portion located on the rib, and an upper portion located on the lower portion and protruding from a side surface of the lower portion, forming an organic layer including a first organic layer located on the lower electrode and spaced apart from the lower portion of the partition, and a second organic layer located on the upper portion, the first and second organic layers including light emitting layers formed of a same material, forming an upper electrode including a first upper electrode which is located on the first organic layer and is in contact with the lower portion of the partition, and a second upper electrode located on the second organic layer, forming a cap layer including a first cap layer located on the first upper electrode, and a second cap layer located on the second upper electrode, and forming a sealing layer which covers the first cap layer and the second cap layer.

According to another embodiment, a manufacturing method of a display device comprises forming a lower electrode above a substrate, providing a processing substrate in which the lower electrode is formed on a stage inside a chamber, applying voltage to a counter-electrode facing the stage, introducing a reactant gas into the chamber after an elapse of a predetermined time, and forming an insulating layer overlapping the lower electrode, forming a rib comprising an aperture overlapping the lower electrode by patterning the insulating layer, forming a partition comprising a lower portion located on the rib, and an upper portion located on the lower portion and protruding from a side surface of the lower portion, forming an organic layer including a first organic layer located on the lower electrode and spaced apart from the lower portion of the partition, and a second organic layer located on the upper portion, the first and second organic layers including light emitting layers formed of a same material, forming an upper electrode including a first upper electrode which is located on the first organic layer and is in contact with the lower portion of the partition, and a second upper electrode located on the second organic layer, forming a cap layer including a first cap layer located on the first upper electrode, and a second cap layer located on the second upper electrode, and forming a sealing layer which covers the first cap layer and the second cap layer.

The embodiments can provide a manufacturing method of a display device which can prevent the reduction in reliability.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. A plan view is defined as appearance when various types of elements are viewed parallel to the third direction Z.

When terms indicating the positional relationships of two or more structural elements, such as "on" and "above", are used, the structural elements may be directly in contact with each other or may be spaced apart from each other as a gap or another structural element is interposed between them.

The display device of the present embodiment is an organic electroluminescent display device comprising an organic light emitting diode (OLED) as a display element, and could be mounted on a television, a personal computer, a vehicle-mounted device, a tablet, a smartphone, a mobile phone, etc.

FIG. 1 is a diagram showing a configuration example of a display device DSP.

The display device DSP comprises a display area DA which displays an image and a surrounding area SA around the display area DA on an insulating substrate 10. The substrate 10 may be glass or a resinous film having flexibility.

In the present embodiment, the substrate 10 is rectangular as seen in plan view. It should be noted that the shape of the substrate 10 in a plan view is not limited to a rectangular shape and may be another shape such as a square shape, a circular shape or an elliptic shape.

The display area DA comprises a plurality of pixels PX arrayed in matrix in a first direction X and a second direction Y. Each pixel PX includes a plurality of subpixels SP. For example, each pixel PX includes a red subpixel SP1, a green subpixel SP2 and a blue subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements consisting of thin-film transistors.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the anode of the display element 20.

It should be noted that the configuration of the pixel circuit 1 is not limited to the example shown in the figure. For example, the pixel circuit 1 may comprise more thin-film transistors and capacitors.

The display element 20 is an organic light emitting diode (OLED) as a light emitting element, and may be called an organic EL element. For example, subpixel SP1 comprises a display element 20 which emits light in a red wavelength range. Subpixel SP2 comprises a display element 20 which emits light in a green wavelength range. Subpixel SP3 comprises a display element 20 which emits light in a blue wavelength range.

Figure 2:
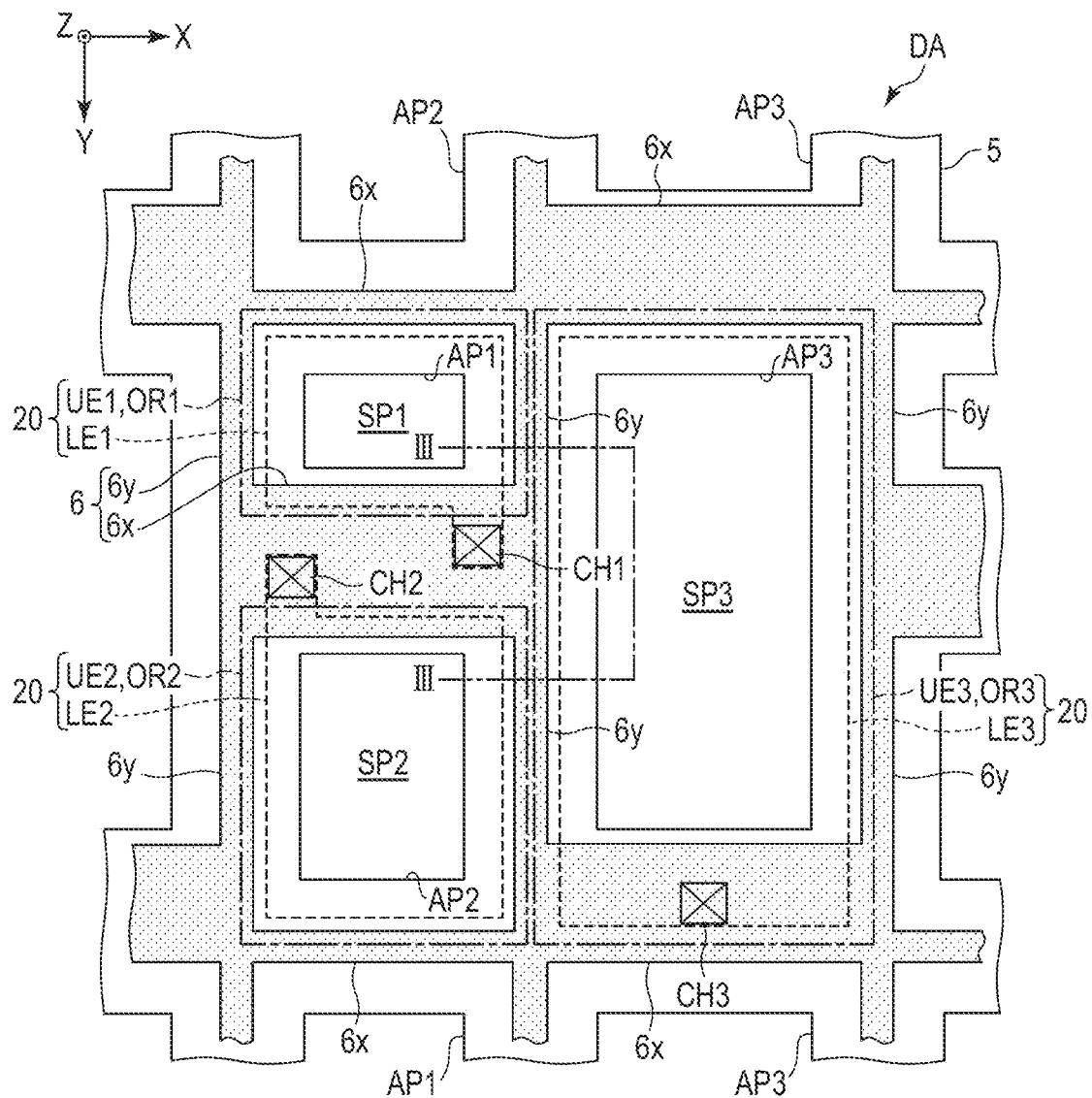
FIG. 2 is a diagram showing an example of the layout of subpixels SP1, SP2 and SP3.

FIG. 2 is a diagram showing an example of the layout of subpixels SP1, SP2 and SP3.

In the example of FIG. 2, subpixels SP1 and SP2 are arranged in the second direction Y. Further, each of subpixels SP1 and SP2 is adjacent to subpixel SP3 in the first direction X.

When subpixels SP1, SP2 and SP3 are provided in line with this layout, in the display area DA, a column in which subpixels SP1 and SP2 are alternately provided in the second direction Y and a column in which a plurality of subpixels SP3 are provided in the second direction Y are formed. These columns are alternately arranged in the first direction X.

It should be noted that the layout of subpixels SP1, SP2 and SP3 is not limited to the example of FIG. 2. As another example, subpixels SP1, SP2 and SP3 in each pixel PX may be arranged in order in the first direction X.

A rib 5 and a partition 6 are provided in the display area DA. The rib 5 comprises apertures AP1, AP2 and AP3 in subpixels SP1, SP2 and SP3, respectively. In the example of FIG. 2, the aperture AP2 is larger than the aperture AP1, and the aperture AP3 is larger than the aperture AP2.

The partition 6 overlaps the rib 5 as seen in plan view. The partition 6 comprises a plurality of first partitions 6x extending in the first direction X and a plurality of second partitions 6y extending in the second direction Y. The first partitions 6x are provided between the apertures AP1 and AP2 which are adjacent to each other in the second direction Y and between two apertures AP3 which are adjacent to each other in the second direction Y. Each second partition 6y is provided between the apertures AP1 and AP3 which are adjacent to each other in the first direction X and between the apertures AP2 and AP3 which are adjacent to each other in the first direction X.

In the example of FIG. 2, the first partitions 6x and the second partitions 6y are connected to each other. Thus, the partition 6 is formed into a grating shape surrounding the apertures AP1, AP2 and AP3 as a whole. In other words, the partition 6 comprises apertures in subpixels SP1, SP2 and SP3 in a manner similar to that of the rib 5.

Subpixel SP1 comprises a lower electrode LE1, an upper electrode UE1 and an organic layer OR1 overlapping the aperture AP1. Subpixel SP2 comprises a lower electrode LE2, an upper electrode UE2 and an organic layer OR2 overlapping the aperture AP2. Subpixel SP3 comprises a lower electrode LE3, an upper electrode UE3 and an organic layer OR3 overlapping the aperture AP3.

In the example of FIG. 2, the outer shapes of the lower electrodes LE1, LE2 and LE3 are shown by dotted lines, and the outer shapes of the organic layers OR1, OR2 and OR3 and the upper electrodes UE1, UE2 and UE3 are shown by alternate long and short dash lines. The peripheral portion of each of the lower electrodes LE1, LE2 and LE3 overlaps the rib 5. The outer shape of the upper electrode UE1 is substantially coincident with the outer shape of the organic layer OR1. The peripheral portion of each of the upper electrode UE1 and the organic layer OR1 overlaps the partition 6. The outer shape of the upper electrode UE2 is substantially coincident with the outer shape of the organic layer OR2. The peripheral portion of each of the upper electrode UE2 and the organic layer OR2 overlaps the partition 6. The outer shape of the upper electrode UE3 is substantially coincident with the outer shape of the organic layer OR3. The peripheral portion of each of the upper electrode UE3 and the organic layer OR3 overlaps the partition 6.

The lower electrode LE1, the upper electrode UE1 and the organic layer OR1 constitute the display element 20 of subpixel SP1. The lower electrode LE2, the upper electrode UE2 and the organic layer OR2 constitute the display element 20 of subpixel SP2. The lower electrode LE3, the upper electrode UE3 and the organic layer OR3 constitute the display element 20 of subpixel SP3. The lower electrodes LE1, LE2 and LE3 correspond to, for example, the anodes of the display elements 20. The upper electrodes UE1, UE2 and UE3 correspond to the cathodes of the display elements 20 or a common electrode.

The lower electrode LE1 is connected to the pixel circuit 1 (see FIG. 1) of subpixel SP1 through a contact hole CH1. The lower electrode LE2 is connected to the pixel circuit 1 of subpixel SP2 through a contact hole CH2. The lower electrode LE3 is connected to the pixel circuit 1 of subpixel SP3 through a contact hole CH3.

Figure 3:
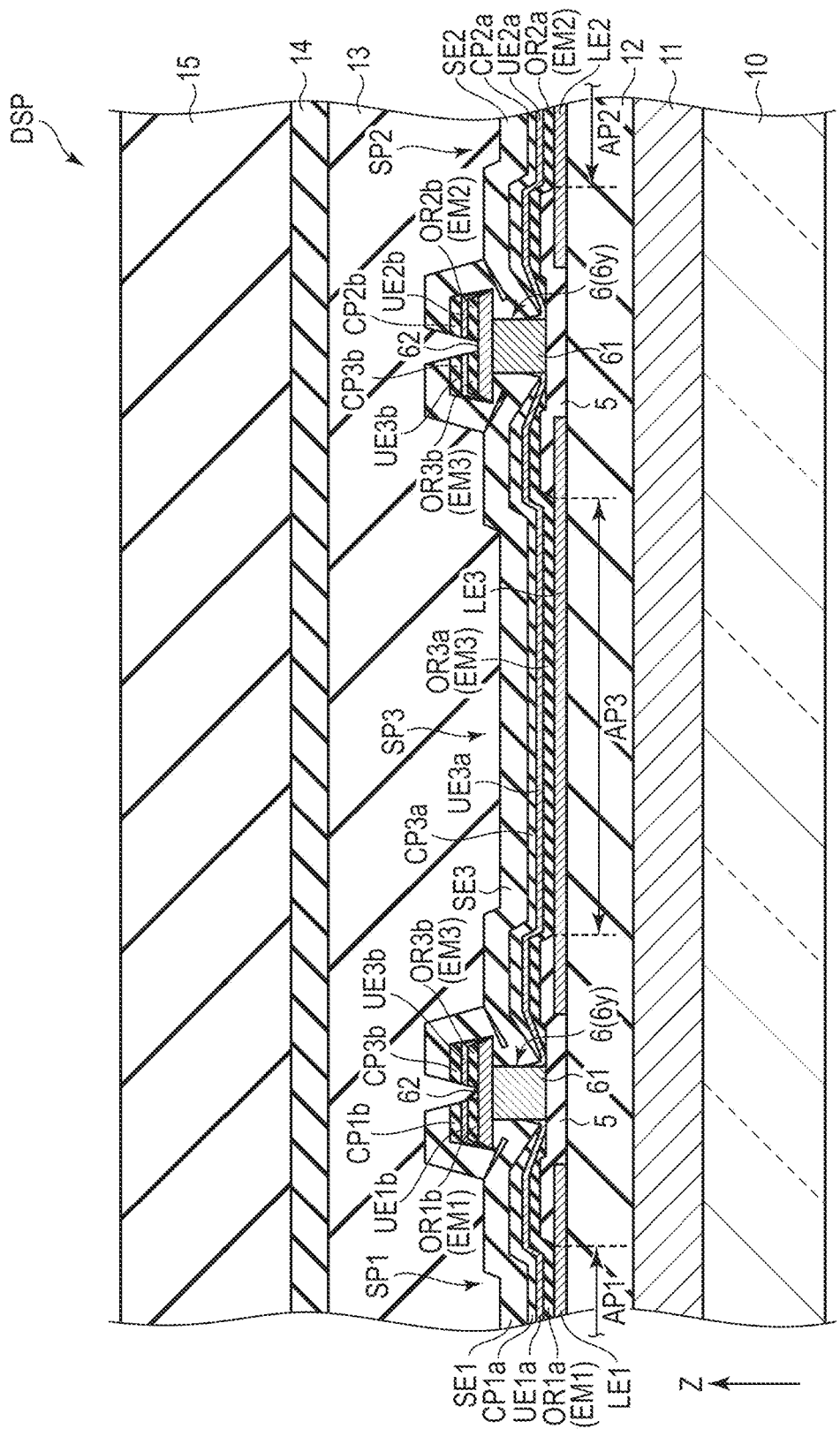
FIG. 3 is a schematic cross-sectional view of the display device DSP along the III-III line of FIG. 2.

FIG. 3 is a schematic cross-sectional view of the display device DSP along the III-III line of FIG. 2.

A circuit layer 11 is provided on the substrate 10 described above. The circuit layer 11 includes various circuits such as the pixel circuit 1, and various lines such as scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrodes LE1, LE2 and LE3 are provided on the insulating layer (organic insulating layer) 12. The rib 5 corresponds to an insulating layer (inorganic insulating layer) and is provided on the insulating layer 12 and the lower electrodes LE1, LE2 and LE3. The end portions of the lower electrodes LE1, LE2 and LE3 are covered with the rib 5.

The partition 6 includes a lower portion (stem) 61 provided on the rib 5 and an upper portion (shade) 62 which covers the upper surface of the lower portion 61. The upper portion 62 has a width greater than that of the lower portion 61. By this configuration, in FIG. 3, the both end portions of the upper portion 62 protrude relative to the side surfaces of the lower portion 61. This shape of the partition 6 may be called an overhang shape.

The organic layer OR1 shown in FIG. 2 includes first and second portions OR1a and OR1b spaced apart from each other as shown in FIG. 3. The first portion OR1a is in contact with the lower electrode LE1 through the aperture AP1, covers the lower electrode LE1 and overlaps part of the rib 5. The second portion OR1b is located on the upper portion 62.

The upper electrode UE1 shown in FIG. 2 includes first and second portions UE1a and UE1b spaced apart from each other as shown in FIG. 3. The first portion UE1a faces the lower electrode LE1 and is located on the first portion OR1a. Further, the first portion UE1a is in contact with a side surface of the lower portion 61. The second portion UE1b is located above the partition 6 and is located on the second portion OR1b.

The organic layer OR2 shown in FIG. 2 includes first and second portions OR2a and OR2b spaced apart from each other as shown in FIG. 3. The first portion OR2a is in contact with the lower electrode LE2 through the aperture AP2, covers the lower electrode LE2 and overlaps part of the rib 5. The second portion OR2b is located on the upper portion 62.

The upper electrode UE2 shown in FIG. 2 includes first and second portions UE2a and UE2b spaced apart from each other as shown in FIG. 3. The first portion UE2a faces the lower electrode LE2 and is located on the first portion OR2a. Further, the first portion UE2a is in contact with a side surface of the lower portion 61. The second portion UE2b is located above the partition 6 and is located on the second portion OR2b.

The organic layer OR3 shown in FIG. 2 includes first and second portions OR3a and OR3b spaced apart from each other as shown in FIG. 3. The first portion OR3a is in contact with the lower electrode LE3 through the aperture AP3, covers the lower electrode LE3 and overlaps part of the rib 5. The second portion OR3b is located on the upper portion 62.

The upper electrode UE3 shown in FIG. 2 includes first and second portions UE3a and UE3b spaced apart from each other as shown in FIG. 3. The first portion UE3a faces the lower electrode LE3 and is located on the first portion OR3a. Further, the first portion UE3a is in contact with a side surface of the lower portion 61. The second portion UE3b is located above the partition 6 and is located on the second portion OR3b.

In the example shown in FIG. 3, subpixels SP1, SP2 and SP3 include cap layers (optical adjustment layers) CP1, CP2 and CP3 for adjusting the optical property of the light emitted from the light emitting layers of the organic layers OR1, OR2 and OR3.

The cap layer CP1 includes first and second portions CP1a and CP1b spaced apart from each other. The first portion CP1a is located in the aperture AP1 and is located on the first portion UE1a. The second portion CP1b is located above the partition 6 and is located on the second portion UE1b.

The cap layer CP2 includes first and second portions CP2a and CP2b spaced apart from each other. The first portion CP2a is located in the aperture AP2 and is located on the first portion UE2a. The second portion CP2b is located above the partition 6 and is located on the second portion UE2b.

The cap layer CP3 includes first and second portions CP3a and CP3b spaced apart from each other. The first portion CP3a is located in the aperture AP3 and is located on the first portion UE3a. The second portion CP3b is located above the partition 6 and is located on the second portion UE3b.

Sealing layers SE1, SE2 and SE3 are provided in subpixels SP1, SP2 and SP3, respectively. The sealing layer SE1 continuously covers the members of subpixel SP1 including the first portion CP1a, the partition 6 and the second portion CP1b. The sealing layer SE2 continuously covers the members of subpixel SP2 including the first portion CP2a, the partition 6 and the second portion CP2b. The sealing layer SE3 continuously covers the members of subpixel SP3 including the first portion CP3a, the partition 6 and the second portion CP3b.

In the example of FIG. 3, the second portion OR1b, the second portion UE1b, the second portion CP1b and the sealing layer SE1 on the partition 6 between subpixels SP1 and SP3 are spaced apart from the second portion OR3b, the second portion UE3b, the second portion CP3b and the sealing layer SE3 on this partition 6. The second portion OR2b, the second portion UE2b, the second portion CP2b and the sealing layer SE2 on the partition 6 between subpixels SP2 and SP3 are spaced apart from the second portion OR3b, the second portion UE3b, the second portion CP3b and the sealing layer SE3 on this partition 6.

The sealing layers SE1, SE2 and SE3 are covered with a resinous layer 13. The resinous layer 13 is covered with a sealing layer 14. Further, the sealing layer 14 is covered with a resinous layer 15.

The insulating layer 12 is an organic insulating layer formed of an organic material.

The rib 5 is an inorganic insulating layer formed of the same material as the sealing layers SE1, SE2 and SE3. The rib 5 and the sealing layers 14, SE1, SE2 and SE3 are inorganic insulating layers and are formed of, for example, silicon nitride (SiNx). The thickness of the rib 5 is sufficiently less than that of the partition 6 and the insulating layer 12. For example, the thickness of the rib 5 is greater than or equal to 200 nm but less than or equal to 400 nm.

The lower portion 61 of the partition 6 is formed of a conductive material. Both the lower portion 61 and the upper portion 62 of the partition 6 may be conductive.

The lower electrodes LE1, LE2 and LE3 may be formed of a transparent conductive material such as ITO or may comprise a multilayer structure of a metal material such as silver (Ag) and a transparent conductive material. The upper electrodes UE1, UE2 and UE3 are formed of, for example, a metal material such as an alloy of magnesium and silver (MgAg). The upper electrodes UE1, UE2 and UE3 may be formed of a transparent conductive material such as ITO.

When the potential of the lower electrodes LE1, LE2 and LE3 is relatively higher than that of the upper electrodes UE1, UE2 and UE3, the lower electrodes LE1, LE2 and LE3 correspond to anodes, and the upper electrodes UE1, UE2 and UE3 correspond to cathodes. When the potential of the upper electrodes UE1, UE2 and UE3 is relatively higher than that of the lower electrodes LE1, LE2 and LE3, the upper electrodes UE1, UE2 and UE3 correspond to anodes, and the lower electrodes LE1, LE2 and LE3 correspond to cathodes.

The organic layers OR1, OR2 and OR3 include a plurality of functional layers. The first and second portions OR1a and OR1b of the organic layer OR1 include light emitting layers EM1 formed of the same material. The first and second portions OR2a and OR2b of the organic layer OR2 include light emitting layers EM2 formed of the same material. The first and second portions OR3a and OR3b of the organic layer OR3 include light emitting layers EM3 formed of the same material. The light emitting layer EM1, the light emitting layer EM2 and the light emitting layer EM3 are formed of materials which emit light of different wavelength ranges.

The cap layers CP1, CP2 and CP3 are formed by, for example, a multilayer body of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3. It should be noted that the cap layers CP1, CP2 and CP3 may be omitted.

Common voltage is applied to the partition 6. This common voltage is applied to, of the upper electrodes, the first portions UE1a, UE2a and UE3a which are in contact with the side surfaces of the lower portions 61. Pixel voltage is applied to the lower electrodes LE1, LE2 and LE3 through the pixel circuits 1 provided in subpixels SP1, SP2 and SP3, respectively.

When a potential difference is formed between the lower electrode LE1 and the upper electrode UE1, the light emitting layer EM1 of the first portion OR1a of the organic layer OR1 emits light in a red wavelength range. When a potential difference is formed between the lower electrode LE2 and the upper electrode UE2, the light emitting layer EM2 of the first portion OR2a of the organic layer OR2 emits light in a green wavelength range. When a potential difference is formed between the lower electrode LE3 and the upper electrode UE3, the light emitting layer EM3 of the first portion OR3a of the organic layer OR3 emits light in a blue wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including a quantum dot which generates light exhibiting colors corresponding to subpixels SP1, SP2 and SP3 by the excitation caused by the light emitted from the light emitting layers.

Figure 4:
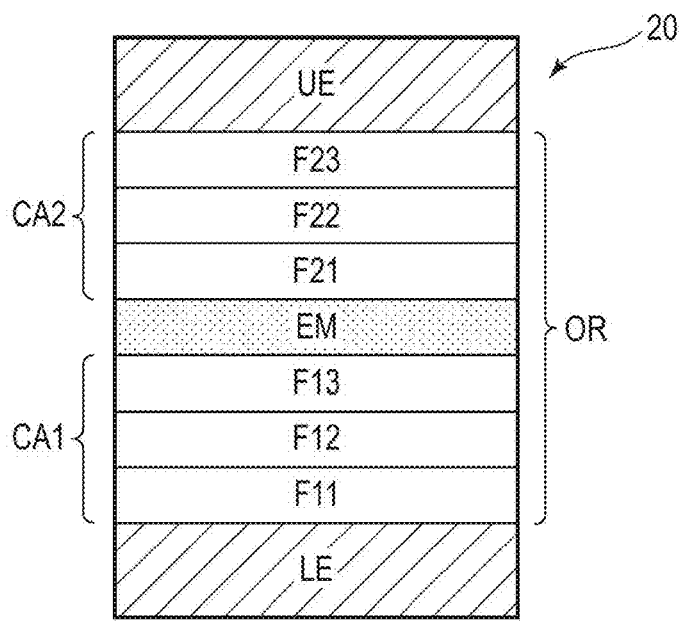
FIG. 4 is a diagram showing an example of the configuration of a display element 20.

FIG. 4 is a diagram showing an example of the configuration of the display element 20.

The lower electrode LE shown in FIG. 4 corresponds to each of the lower electrodes LE1, LE2 and LE3 of FIG. 3. The organic layer OR shown in FIG. 4 corresponds to each of the organic layers OR1, OR2 and OR3 of FIG. 3. The upper electrode UE shown in FIG. 4 corresponds to each of the upper electrodes UE1, UE2 and UE3 of FIG. 3.

The organic layer OR comprises a carrier adjustment layer CA1, a light emitting layer EM and a carrier adjustment layer CA2. The carrier adjustment layer CA1 is located between the lower electrode LE and the light emitting layer EM. The carrier adjustment layer CA2 is located between the light emitting layer EM and the upper electrode UE. The carrier adjustment layers CA1 and CA2 include a plurality of functional layers. Hereinafter, this specification explains an example in which the lower electrode LE corresponds to an anode and the upper electrode UE corresponds to a cathode.

The carrier adjustment layer CA1 includes a hole-injection layer F11, a hole-transport layer F12, an electron blocking layer F13 and the like as functional layers. The hole-injection layer F11 is provided on the lower electrode LE. The hole-transport layer F12 is provided on the hole-injection layer F11. The electron blocking layer F13 is provided on the hole-transport layer F12. The light emitting layer EM is provided on the electron blocking layer F13.

The carrier adjustment layer CA2 includes a hole blocking layer F21, an electron-transport layer F22, an electron-injection layer F23 and the like as functional layers. The hole blocking layer F21 is provided on the light emitting layer EM. The electron-transport layer F22 is provided on the hole blocking layer F21. The electron-injection layer F23 is provided on the electron-transport layer F22. The upper electrode UE is provided on the electron-injection layer F23.

In addition to the functional layers described above, the carrier adjustment layers CA1 and CA2 may include other functional layers such as a carrier generation layer as needed, or at least one of the above functional layers may be omitted.

Now, this specification explains an example of the manufacturing method of the display device DSP.

Figure 5:
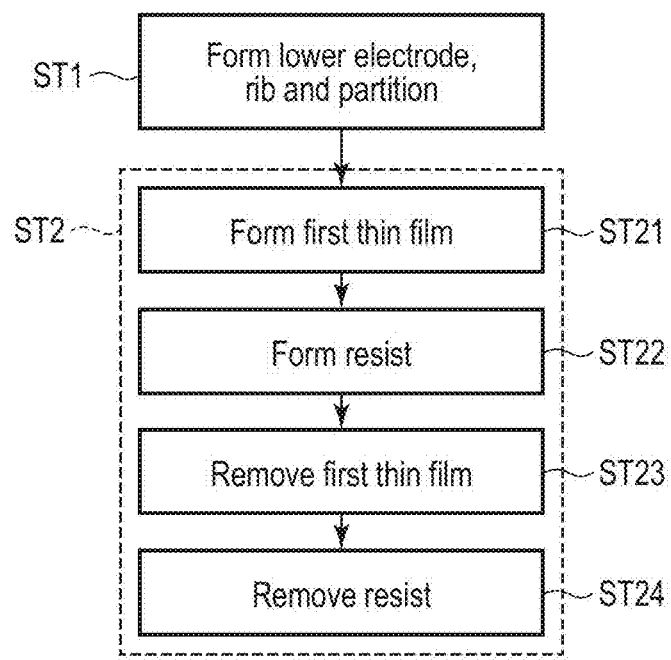
FIG. 5 is a flow diagram for explaining an example of the manufacturing method of the display device DSP.

FIG. 5 is a flow diagram for explaining an example of the manufacturing method of the display device DSP.

The manufacturing method shown here roughly includes the process of preparing a processing substrate SUB which is the base of subpixels SPα, SPβ and SPγ (step ST1) and the process of forming subpixel SPα (step ST2). After step ST2, the process of forming subpixel SPβ is performed in a manner similar to that of the process of forming subpixel SPα. Further, the process of forming subpixel SPγ is performed. It should be noted that each of subpixels SPα, SPβ and SPγ here is one of the above subpixels SP1, SP2 and SP3.

In step ST1, first, the processing substrate SUB is prepared by forming lower electrodes LEα, LEβ and LEγ, the rib 5 and the partition 6 on the substrate 10. The details are described later.

In step ST2, first, a first thin film 31 including a light emitting layer EMα is formed in the processing substrate SUB (step ST21). Subsequently, a resist 41 patterned into a predetermined shape is formed on the first thin film 31 (step ST22). Subsequently, part of the first thin film 31 is removed by etching using the resist 41 as a mask (step ST23). Subsequently, the resist 41 is removed (step ST24). In this way, subpixel SPα is formed. Subpixel SPα comprises a display element 21 comprising the first thin film 31 having a predetermined shape.

The process of forming subpixel SPβ includes a process similar to step ST21 to step ST24. However, in step ST21, instead of the first thin film 31, a second thin film 32 including a light emitting layer EMβ is formed. By patterning the second thin film 32, subpixel SPβ is formed. Subpixel SPβ comprises a display element 22 comprising the second thin film 32 having a predetermined shape.

The process of forming subpixel SPγ includes a process similar to step ST21 to step ST24. However, in step ST21, instead of the first thin film 31, a third thin film 33 including a light emitting layer EMγ is formed. By patterning the third thin film 33, subpixel SPγ is formed. Subpixel SPγ comprises a display element 23 comprising the third thin film 33 having a predetermined shape.

The light emitting layer EMα, the light emitting layer EMβ and the light emitting layer EMγ are formed of materials which emit light in wavelength ranges different from each other.

The illustrations of the second thin film 32, the light emitting layer EMβ, the display element 22, the third thin film 33, the light emitting layer EMγ and the display element 23 are omitted.

FIG. 6 to FIG. 10 are diagrams for explaining the process of preparing the processing substrate SUB. In each figure, of the processing substrate SUB, the portion of forming the partition 6 between subpixel SPα and subpixel SPβ is enlarged.

Here, this specification explains a first formation method for forming the rib 5 by silicon nitride (SiN).

Figure 6:
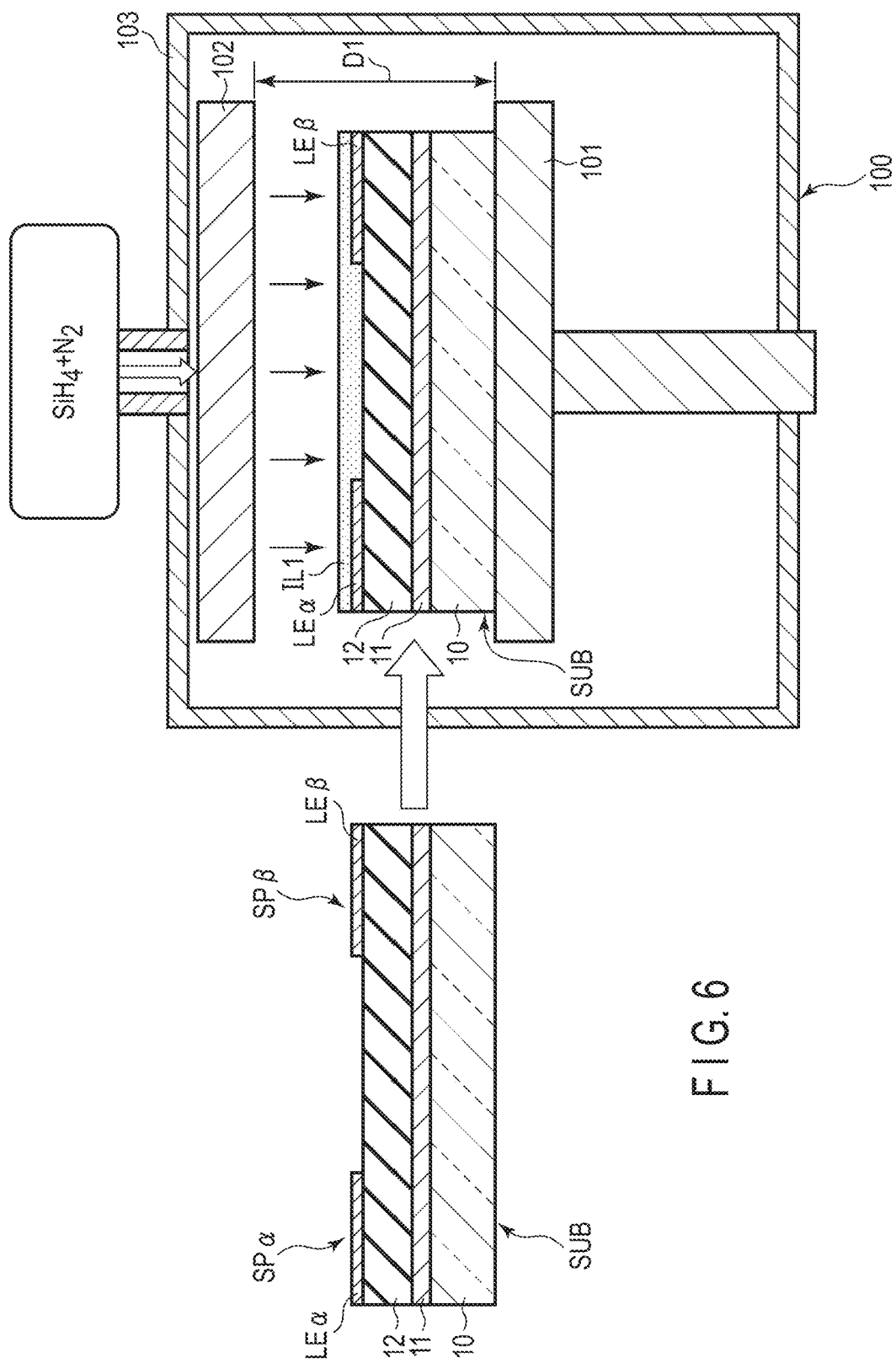
FIG. 6 is a diagram for explaining the process of preparing a processing substrate SUB.

First, as shown on the left side of FIG. 6, the lower electrodes LEα and LEβ are formed above the substrate 10. The circuit layer 11 and the insulating layer 12 are interposed between the substrate 10 and the lower electrodes LEα and LEβ. The lower electrodes LEα and LEβ are located on the insulating layer 12.

As shown on the right side of FIG. 6, a manufacturing device 100 for forming an insulating layer IL which is a silicon nitride layer is, for example, a plasma CVD device, and comprises a stage 101, a counter-electrode 102 facing the stage 101, and a chamber 103 which accommodates the stage 101 and the counter-electrode 102. For example, the manufacturing device 100 is configured to introduce a gas mixture of silicon tetrahydride ($SiH_4$) and nitrogen ($N_2$) as a reactant gas into the chamber 103.

The processing substrate SUB in which the lower electrodes LEα and LEβ are formed is introduced into the chamber 103 and is provided on the stage 101. The processing substrate SUB is located between the stage 101 and the counter-electrode 102. A first distance D1 is formed between the stage 101 and the counter-electrode 102. The first distance D1 is maintained. Subsequently, the reactant gas described above is introduced into the chamber 103. Voltage is applied to the counter-electrode 102. By this process, discharge is started inside the chamber 103 to generate plasma. In this way, a first insulating layer IL1 which is a silicon nitride layer overlapping the lower electrodes LEα and LEβ is formed. The first insulating layer IL1 overlaps the insulating layer 12 between the lower electrodes LEα and LEβ. The state in which the first distance D1 is formed is maintained for five seconds or more.

Figure 7:
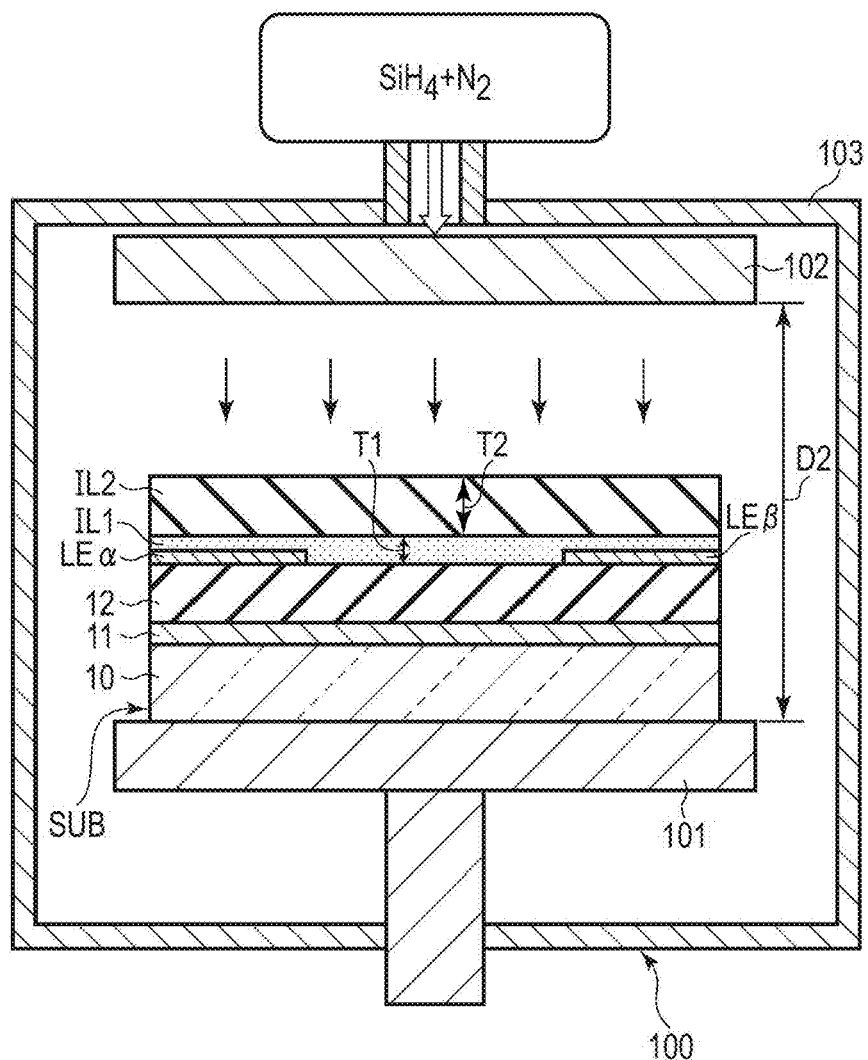
FIG. 7 is a diagram for explaining the process of preparing the processing substrate SUB.

Subsequently, as shown in FIG. 7, a second distance D2 is formed between the stage 101 and the counter-electrode 102. The second distance D2 is maintained. The second distance D2 is greater than the first distance D1. The first distance D1 is changed to the second distance D2 in a state where, for example, voltage is applied to the counter-electrode 102 while introducing the reactant gas into the chamber 103. In other words, the interelectrode distance is changed while continuing the formation of the insulating layer IL in the processing substrate SUB. It should be noted that the interelectrode distance may be changed in a state where the voltage application to the counter-electrode 102 is suspended.

The pressure inside the chamber 103 in a state where the second distance D2 is formed is higher than the pressure inside the chamber 103 in a state where the first distance D1 shown in FIG. 6 is formed. The state in which the second distance D2 is formed is maintained longer than the state in which the first distance D1 is formed. In this way, a second insulating layer IL2 which is a silicon nitride layer is formed on the first insulating layer IL1. The thickness T2 of the second insulating layer IL2 formed in this manner is greater than the thickness T1 of the first insulating layer IL1.

Figure 8:
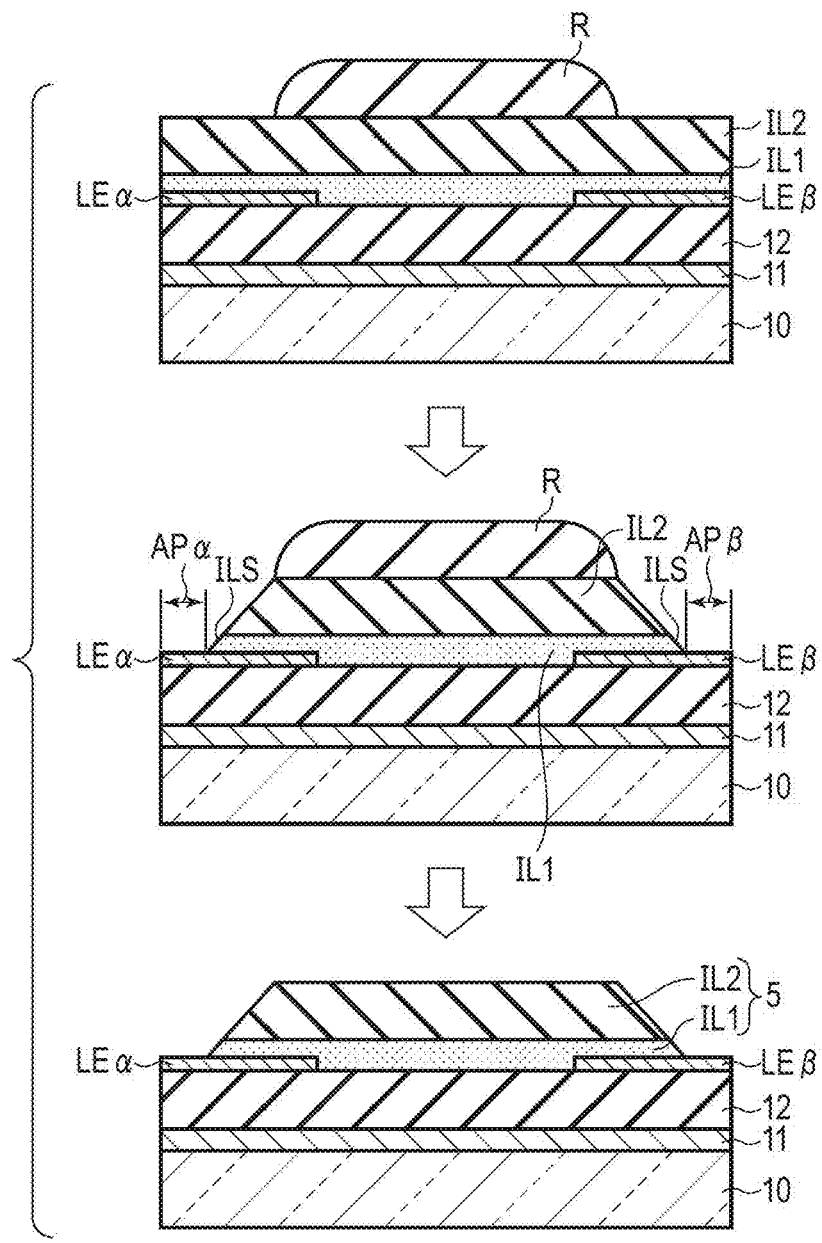
FIG. 8 is a diagram for explaining the process of preparing the processing substrate SUB.

Subsequently, as shown in FIG. 8, the first insulating layer IL1 and the second insulating layer IL2 are patterned.

First, as shown in the upper part of FIG. 8, a resist R patterned into a predetermined shape is formed on the second insulating layer IL2.

Subsequently, as shown in the middle part of FIG. 8, the first insulating layer IL1 and the second insulating layer IL2 are etched using the resist R as a mask. By this process, in the first insulating layer IL1 and the second insulating layer IL2, an aperture APα which penetrates the layers so as to expose the lower electrode LEα and an aperture APβ which penetrates the layers so as to expose the lower electrode LEβ are formed. At this time, a stacked layer body of the first insulating layer IL1 and the second insulating layer IL2 is formed into a taper shape such that the width is decreased toward the upper side. The first insulating layer IL1 extends to the external side relative to the second insulating layer IL2 and comprises inclined surfaces ILS intersecting with the lower electrodes LEα and LEβ at an acute angle.

Subsequently, as shown in the lower part of FIG. 8, the resist R is removed. In this way, the rib 5 consisting of the first insulating layer IL1 and the second insulating layer IL2 is formed. The thickness of the rib 5 is, for example, greater than or equal to 200 nm but less than or equal to 400 nm.

As described above, the first insulating layer IL1 is formed in a state set to a short interelectrode distance (first distance D1). Thus, the first insulating layer IL1 comprises a dense film. Thus, in the dry etching of the first insulating layer IL1 and the second insulating layer IL2, the first insulating layer IL1 is not excessively removed. The desired inclined surfaces ILS can be formed. The end portions of the lower electrodes LEα and LEβ can be assuredly covered with the first insulating layer IL1.

Figure 9:
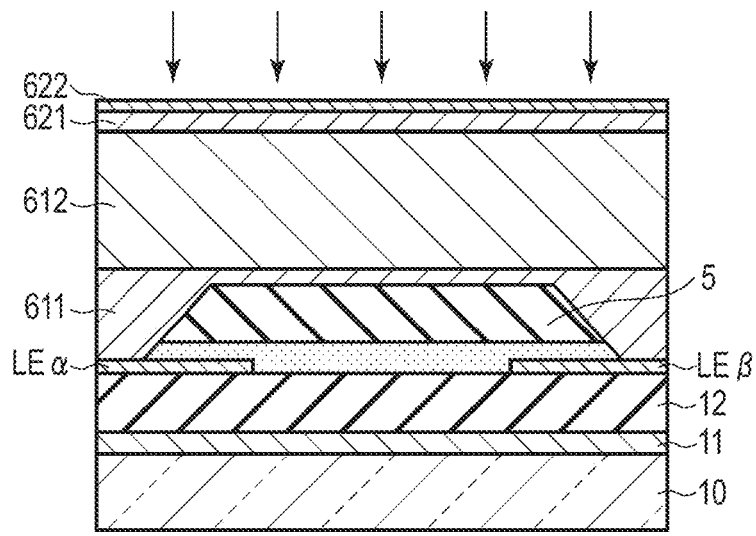
FIG. 9 is a diagram for explaining the process of preparing the processing substrate SUB.

Subsequently, as shown in FIG. 9, a metal layer 611 is formed on the lower electrodes LEα and LEβ and the rib 5.

Subsequently, a metal layer 612 is formed on the metal layer 611. The metal layer 612 is thicker than the rib 5 and thicker than the metal layer 611. The total thickness of the metal layers 611 and 612 is greater than 500 nm, and is further, for example, greater than or equal to 700 nm.

Subsequently, a thin film 621 is formed on the metal layer 612. Subsequently, a thin film 622 is formed on the thin film 621. The total thickness of the thin films 621 and 622 is thinner than the metal layer 612 and thinner than the rib 5. The thin film 622 is thinner than the thin film 621.

Figure 10:
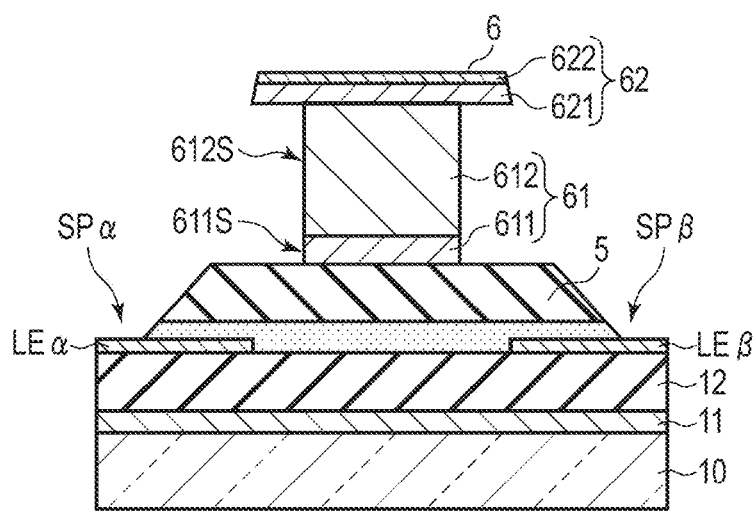
FIG. 10 is a diagram for explaining the process of preparing the processing substrate SUB.

Subsequently, as shown in FIG. 10, the metal layer 611, the metal layer 612, the thin film 621 and the thin film 622 are etched. In this way, the partition 6 comprising the lower portion 61 and the upper portion 62 is formed. The lower portion 61 includes the metal layer 611 and the metal layer 612. The upper portion 62 includes the thin film 621 and the thin film 622. The thin films 621 and 622 constituting the upper portion 62 protrude relative to the side surfaces 611S and 612S of the metal layers 611 and 612 constituting the lower portion 61.

Now, this specification explains a second formation method for forming the rib 5 by silicon nitride (SiN). In the explanation of the second formation method, descriptions overlapping the first formation method may be omitted.

Figure 11:
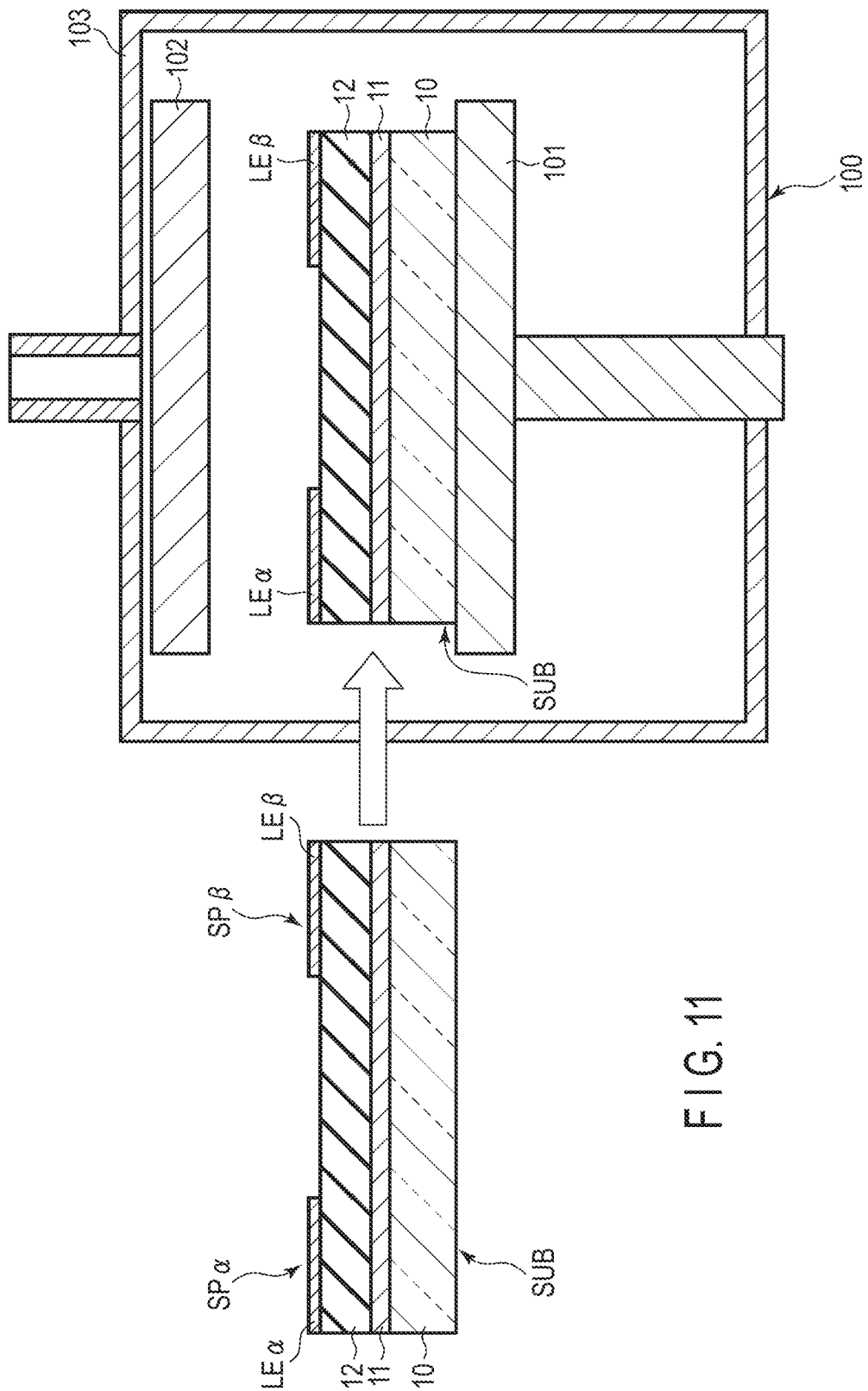
FIG. 11 is a diagram for explaining the process of preparing the processing substrate SUB.

First, as shown on the left side of FIG. 11, the processing substrate SUB is prepared by forming the lower electrodes LEα and LEβ above the substrate 10.

Subsequently, as shown on the right side of FIG. 11, the processing substrate SUB is introduced into the chamber 103 and is provided on the stage 101. By applying voltage to the counter-electrode 102, discharge is started inside the chamber 103. However, at the time of the start of the discharge, no reactant gas is introduced into the chamber 103.

FIG. 12 is a diagram showing the relationship between the time for applying voltage to the counter-electrode 102 and discharge power. In the figure, the horizontal axis indicates the time (sec). In the figure, the vertical axis indicates discharge power (W).

The time at which the application of voltage to the counter-electrode 102 is started (or discharge is started) is defined as time T1. The time at which discharge power becomes constant is defined as time T2. The time at which a predetermined time has passed from time T2 is defined as time T3. The time at which a predetermined time has passed from time T3 is defined as time T4. For example, the required time from time T1 to time T2 is approximately five seconds.

In the second formation method explained here, voltage is applied to the counter-electrode 102 before the introduction of a reactant gas into the chamber 103. After time T2 at which discharge power becomes constant, a gas mixture of silicon tetrahydride (SiH$_4$) and nitrogen (N$_2$) as a reactant gas is introduced into the chamber 103. For example, the time from the start of the application of voltage to the counter-electrode 102 to the start of the introduction of a reactant gas is greater than or equal to five seconds.

In this way, the insulating layer IL can be formed in a state where discharge power is stabilized.

Figure 13:
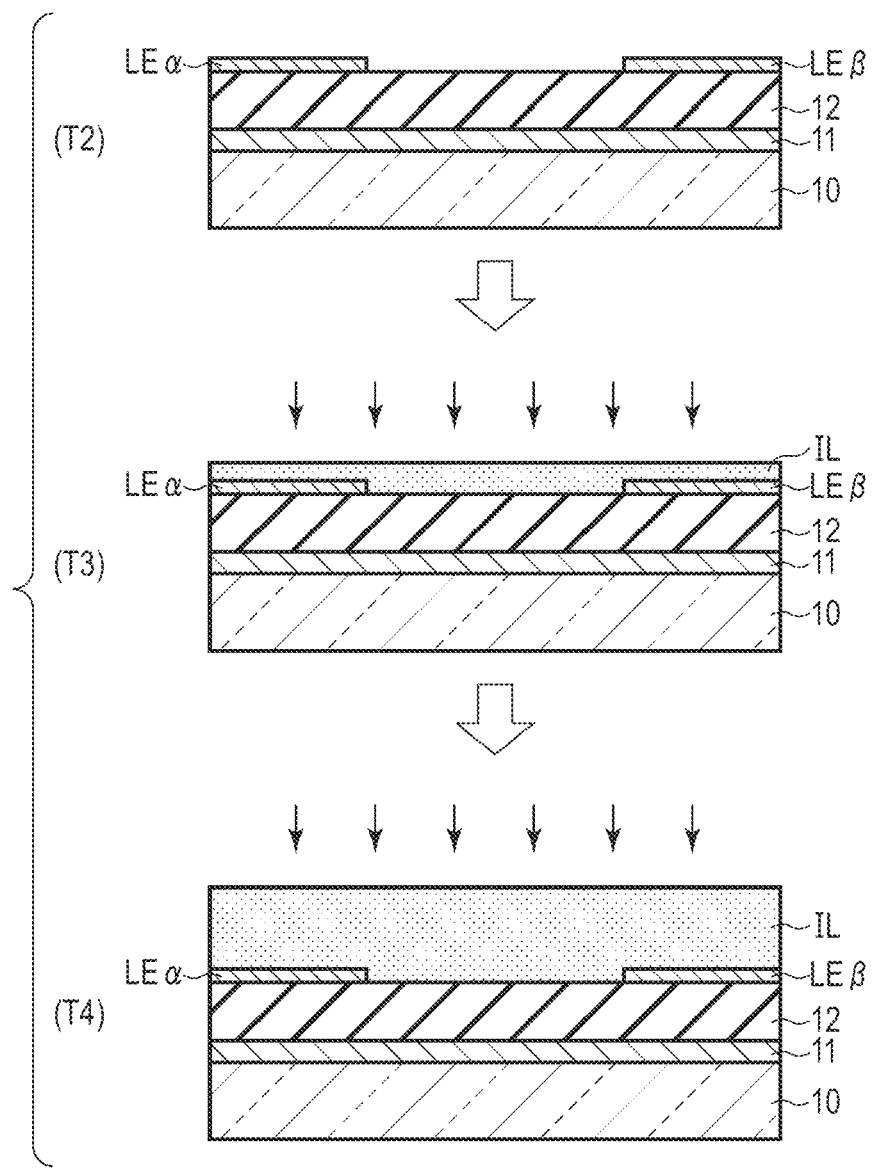
FIG. 13 is a diagram for explaining the process of preparing the processing substrate SUB.

As shown in the upper part of FIG. 13, at time T2, no reactant gas is introduced. Thus, the insulating layer IL is not formed. Subsequently, a reactant gas is introduced into the chamber 103 to start the formation of the insulating layer IL.

As shown in the middle part of FIG. 13, at time T3 when a predetermined time has passed from the start of the introduction of a reactant gas, the thin insulating layer IL is formed. The reactant gas is continuously introduced to maintain discharge power constant.

As shown in the lower part of FIG. 13, at time T4 when a further predetermined time has passed, the insulating layer IL having the desired thickness is formed. The insulating layer IL is formed as a silicon nitride layer comprising a dense and uniform film.

Subsequently, as shown in FIG. 14, the insulating layer IL is patterned.

First, as shown in the upper part of FIG. 14, the resist R patterned into a predetermined shape is formed on the insulating layer IL.

Subsequently, as shown in the middle part of FIG. 14, the insulating layer IL is etched using the resist R as a mask. By this process, in the insulating layer IL, the aperture APα which penetrates the layer so as to expose the lower electrode LEα and the aperture APβ which penetrates the layer so as to expose the lower electrode LEβ are formed. At this time, the insulating layer IL is formed into a taper shape such that the width is decreased toward the upper side.

Subsequently, as shown in the lower part of FIG. 14, the resist R is removed. In this way, the rib 5 is formed. The thickness of the rib 5 is, for example, greater than or equal to 200 nm but less than or equal to 400 nm.

Subsequently, as shown in FIG. 15, the metal layer 611 is formed on the lower electrodes LEα and LEβ and the rib 5.

Subsequently, the metal layer 612 is formed on the metal layer 611. The metal layer 612 is thicker than the rib 5 and thicker than the metal layer 611. The total thickness of the metal layers 611 and 612 is greater than 500 nm, and is further, for example, greater than or equal to 700 nm.

Subsequently, the thin film 621 is formed on the metal layer 612. Subsequently, the thin film 622 is formed on the thin film 621. The total thickness of the thin films 621 and 622 is thinner than the metal layer 612 and thinner than the rib 5. The thin film 622 is thinner than the thin film 621.

Subsequently, as shown in FIG. 16, the metal layer 611, the metal layer 612, the thin film 621 and the thin film 622 are etched. In this way, the partition 6 comprising the lower portion 61 and the upper portion 62 is formed. The lower portion 61 includes the metal layer 611 and the metal layer 612. The upper portion 62 includes the thin film 621 and the thin film 622. The thin films 621 and 622 constituting the upper portion 62 protrude relative to the side surfaces 611S and 612S of the metal layers 611 and 612 constituting the lower portion 61.

Figure 17:
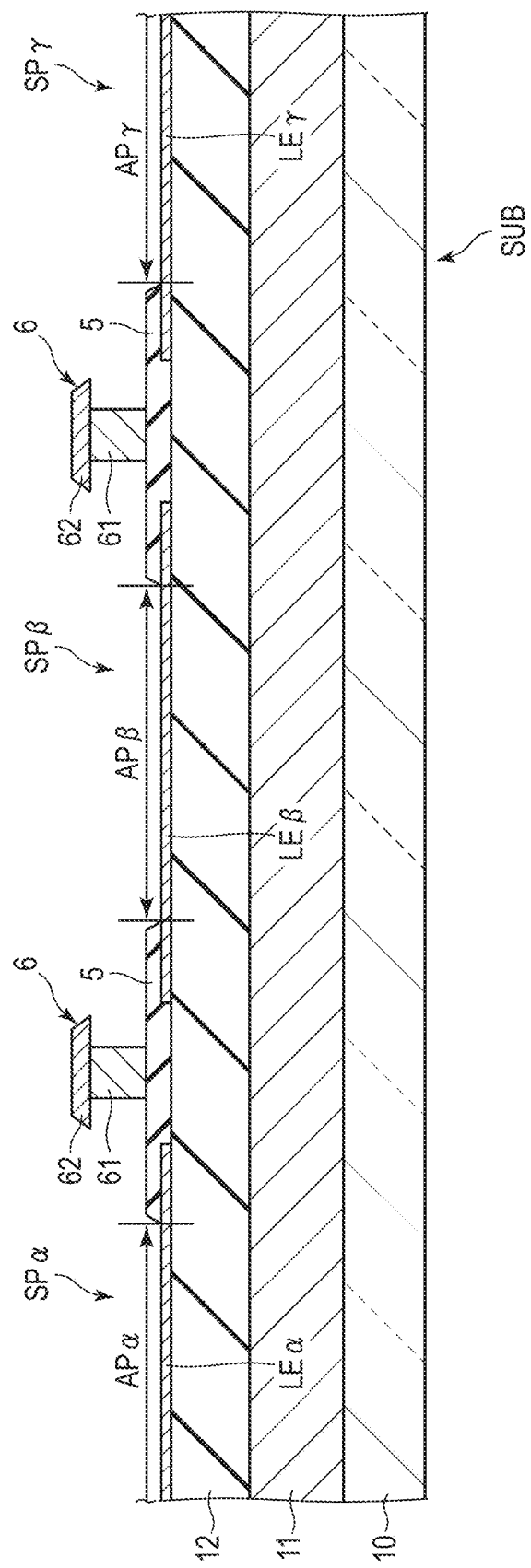
FIG. 17 is a cross-sectional view of the processing substrate SUB prepared through step ST1.

The processing substrate SUB prepared through the above process is shown in FIG. 17.

The processing substrate SUB comprises the lower electrode LEα of subpixel SPα, the lower electrode LEβ of subpixel SPβ, the lower electrode LEγ of subpixel SPγ, the rib 5 comprising apertures APα, APβ and APγ overlapping the lower electrodes LEα, LEβ and LEγ, respectively, and the partition 6 provided on the rib 5, above the substrate 10. In FIG. 18 to FIG. 22, the illustrations of the substrate 10 and the circuit layer 11 lower than the insulating layer 12 are omitted.

Now, this specification explains the process of forming subpixel SPα shown in FIG. 5 (step ST2).

Figure 18:
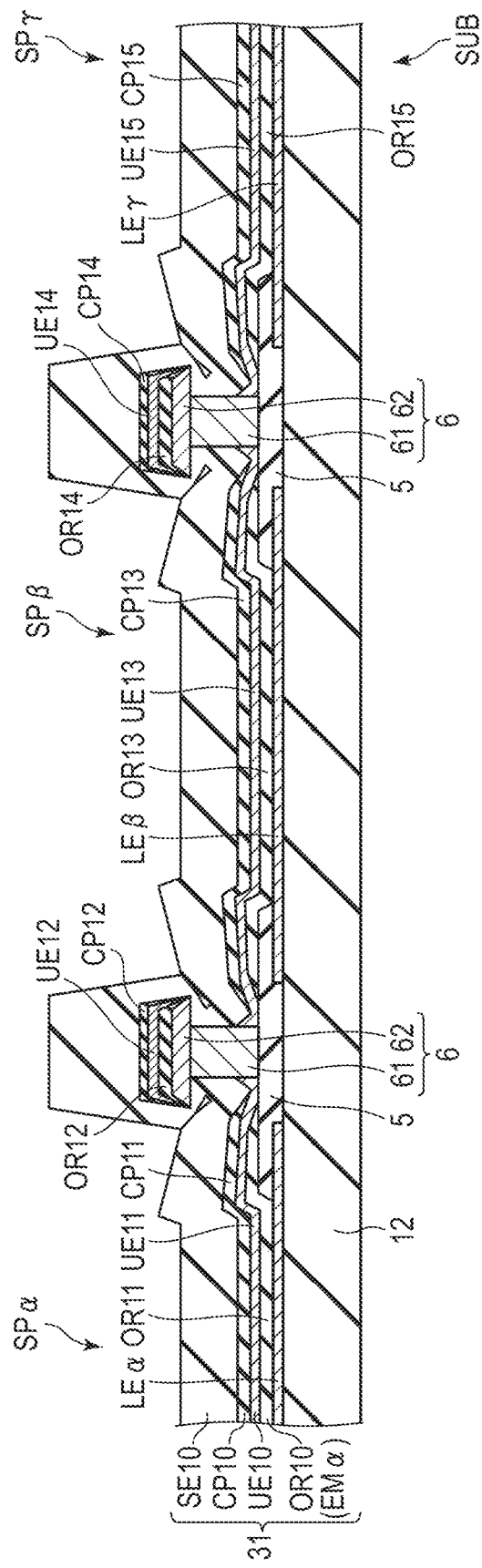
FIG. 18 is a diagram for explaining the process of forming a first thin film 31.

In step ST21, as shown in FIG. 18, the first thin film 31 is formed over subpixel SPα, subpixel SPβ and subpixel SPγ. The process of forming the first thin film 31 includes, on the processing substrate SUB, the process of forming an organic layer OR10 including the light emitting layer EMα, the process of forming an upper electrode UE10 on the organic layer OR10, the process of forming a cap layer CP10 on the upper electrode UE10 and the process of forming a sealing layer SE10 on the cap layer CP10. Here, the sealing layer SE10 is formed of silicon nitride. Thus, in the example shown in the figure, the first thin film 31 includes the organic layer OR10, the upper electrode UE10, the cap layer CP10 and the sealing layer SE10.

The organic layer OR10 includes a first organic layer OR11, a second organic layer OR12, a third organic layer OR13, a fourth organic layer OR14 and a fifth organic layer OR15. Each of the first organic layer OR11, the second organic layer OR12, the third organic layer OR13, the fourth organic layer OR14 and the fifth organic layer OR15 includes the light emitting layer EMα.

The first organic layer OR11 is formed so as to cover the lower electrode LEα. The second organic layer OR12 is spaced apart from the first organic layer OR11 and is located on the upper portion 62 of the partition 6 between the lower electrode LEα and the lower electrode LEβ. The third organic layer OR13 is spaced apart from the second organic layer OR12 and is formed so as to cover the lower electrode LEβ. The fourth organic layer OR14 is spaced apart from the third organic layer OR13 and is located on the upper portion 62 of the partition 6 between the lower electrode LEβ and the lower electrode LEγ. The fifth organic layer OR15 is spaced apart from the fourth organic layer OR14 and is formed so as to cover the lower electrode LEγ.

The upper electrode UE10 includes a first upper electrode UE11, a second upper electrode UE12, a third upper electrode UE13, a fourth upper electrode UE14 and a fifth upper electrode UE15.

The first upper electrode UE11 is located on the first organic layer OR11 and is in contact with the lower portion 61 of the partition 6 between the lower electrode LEα and the lower electrode LEβ. The second upper electrode UE12 is spaced apart from the first upper electrode UE11 and is located on the second organic layer OR12 between the lower electrode LEα and the lower electrode LEβ. The third upper electrode UE13 is spaced apart from the second upper electrode UE12 and is located on the third organic layer OR13. In the example shown in the figure, the third upper electrode UE13 is in contact with the lower portion 61 of the partition 6 between the lower electrode LEα and the lower electrode LEβ and is in contact with the lower portion 61 of the partition 6 between the lower electrode LEβ and the lower electrode LEγ. However, the third upper electrode UE13 may be in contact with one of these lower portions 61. The fourth upper electrode UE14 is spaced apart from the third upper electrode UE13 and is located on the fourth organic layer OR14 between the lower electrode LEα and the lower electrode LEγ. The fifth upper electrode UE15 is spaced apart from the fourth upper electrode UE14, is located on the fifth organic layer OR15 and is in contact with the lower portion 61 of the partition 6 between the lower electrode LEβ and the lower electrode LEγ.

The cap layer CP10 includes a first cap layer CP11, a second cap layer CP12, a third cap layer CP13, a fourth cap layer CP14 and a fifth cap layer CP15.

The first cap layer CP11 is located on the first upper electrode UE11. The second cap layer CP12 is spaced apart from the first cap layer CP11 and is located on the second upper electrode UE12. The third cap layer CP13 is spaced apart from the second cap layer CP12 and is located on the third upper electrode UE13. The fourth cap layer CP14 is spaced apart from the third cap layer CP13 and is located on the fourth upper electrode UE14. The fifth cap layer CP15 is spaced apart from the fourth cap layer CP14 and is located on the fifth upper electrode UE15.

The sealing layer SE10 is formed so as to cover the first cap layer CP11, the second cap layer CP12, the third cap layer CP13, the fourth cap layer CP14, the fifth cap layer CP15 and the partition 6.

Figure 19:
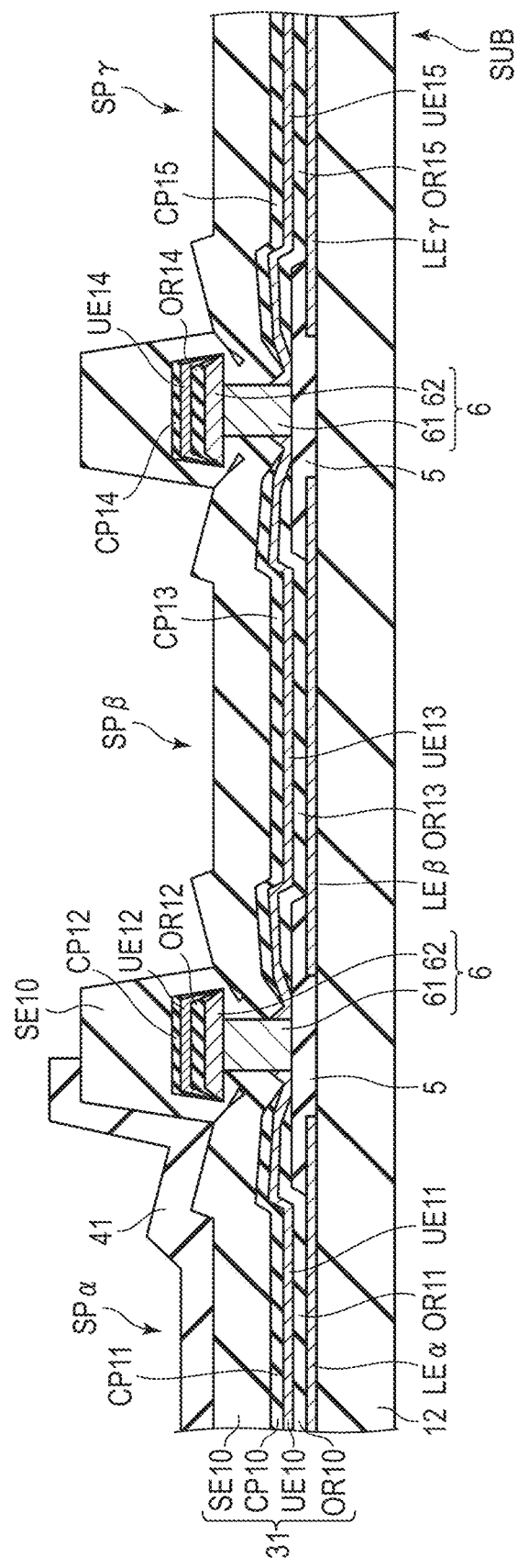
FIG. 19 is a diagram for explaining the process of forming a resist 41.

Subsequently, in step ST22, as shown in FIG. 19, the resist 41 is formed on the sealing layer SE10. The resist 41 covers subpixel SPα. Thus, the resist 41 is provided immediately above the lower electrode LEα, the first organic layer OR11, the first upper electrode UE11 and the first cap layer CP11. The resist 41 extends from subpixel SPα to the upper side of the partition 6. Between subpixel SPα and subpixel SPβ, the resist 41 is provided on the subpixel SPα side (the left side of the figure), and the sealing layer SE10 is exposed from the resist 41 on the subpixel SPβ side (the right side of the figure). In the example shown in the figure, the sealing layer SE10 is exposed from the resist 41 in subpixel SPβ and subpixel SPγ.

Subsequently, in step ST23, the first thin film 31 exposed from the resist 41 is removed by performing etching using the resist 41 as a mask. The process of removing the first thin film 31 includes the process of removing part of the sealing layer SE10, the process of removing part of the cap layer CP10, the process of removing part of the upper electrode UE10 and the process of removing part of the organic layer OR10.

Figure 20:
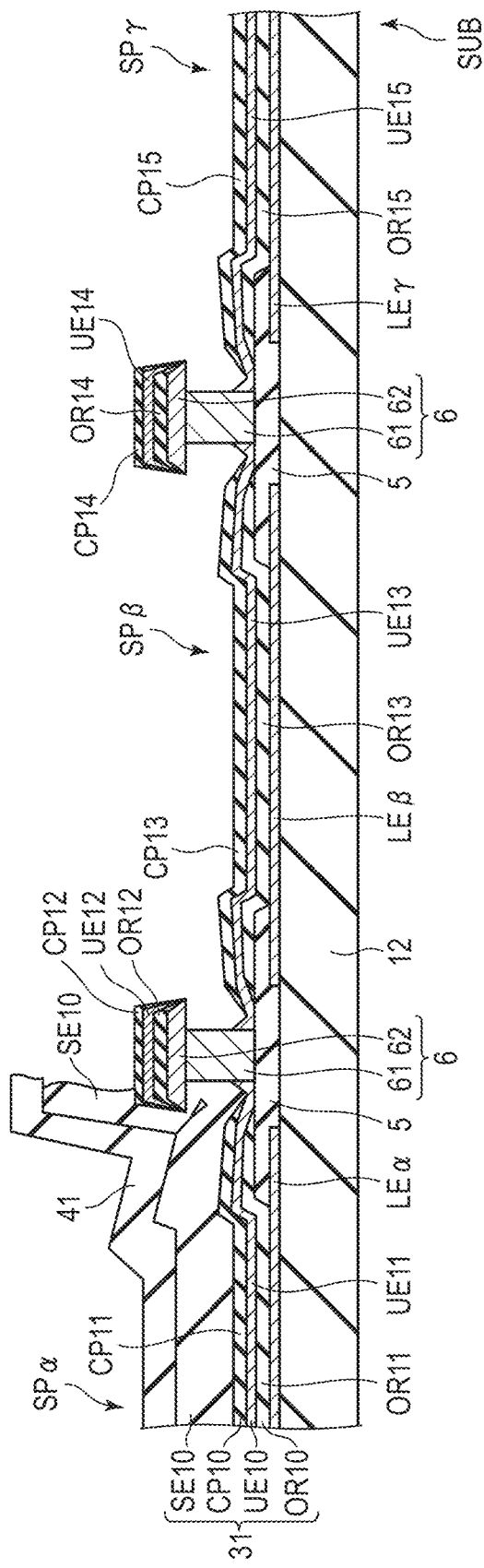
FIG. 20 is a diagram for explaining an etching process using the resist 41 as a mask.

First, as shown in FIG. 20, dry etching is performed using the resist 41 as a mask to remove, of the sealing layer SE10, the portion exposed from the resist 41. In the example shown in the figure, of the sealing layer SE10, the portion which covers subpixel SPα (the portion which covers the first cap layer CP11) and the portion on the subpixel SPα side (the left side of the figure) immediately above the partition 6 (the portion which covers the subpixel SPα side in the second cap layer CP12) remain. To the contrary, of the sealing layer SE10, the portion on the subpixel SPβ side (the right side of the figure) immediately above the partition 6 (the portion which covers the subpixel SPβ side in the second cap layer CP12), the portion which covers subpixel SPβ (the portion which covers the third cap layer CP13), the portion which covers the partition 6 between subpixel SPβ and subpixel SPγ (the portion which covers the fourth cap layer CP14)

and the portion which covers subpixel SPγ (the portion which covers the fifth cap layer CP15) are removed. By this process, part of the second cap layer CP12, the third cap layer CP13, the fourth cap layer CP14 and the fifth cap layer CP15 are exposed from the sealing layer SE10.

Figure 21:
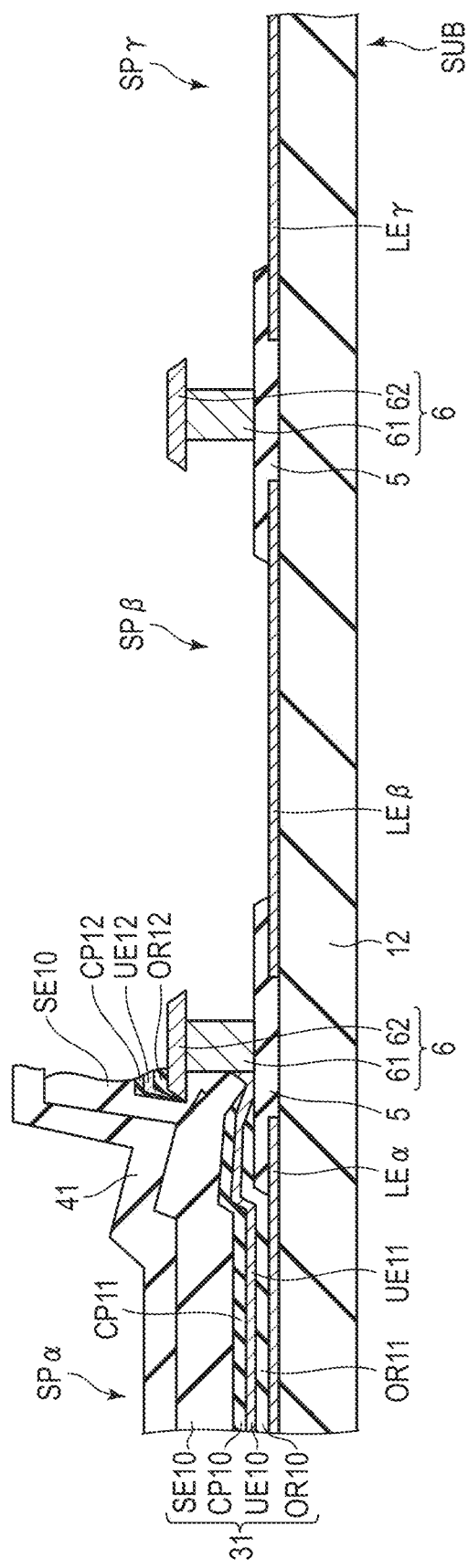
FIG. 21 is a diagram for explaining an etching process using the resist 41 as a mask.

Subsequently, as shown in FIG. 21, etching is performed using the resist 41 as a mask to remove, of the cap layer CP10, the portion exposed from the resist 41 and the sealing layer SE10. In the example shown in the figure, part of the second cap layer CP12, the entire third cap layer CP13, the entire fourth cap layer CP14 and the entire fifth cap layer CP15 are removed.

Subsequently, etching is performed using the resist 41 as a mask to remove, of the upper electrode UE10, the portion exposed from the resist 41, the sealing layer SE10 and the cap layer CP10. In the example shown in the figure, part of the second upper electrode UE12, the entire third upper electrode UE13, the entire fourth upper electrode UE14 and the entire fifth upper electrode UE15 are removed.

Subsequently, etching is performed using the resist 41 as a mask to remove, of the organic layer OR10, the portion exposed from the resist 41, the sealing layer SE10, the cap layer CP10 and the upper electrode UE10. In the example shown in the figure, part of the second organic layer OR12, the entire third organic layer OR13, the entire fourth organic layer OR14 and the entire fifth organic layer OR15 are removed.

Thus, the lower electrode LEβ is exposed in subpixel SPβ, and the lower electrode LEγ is exposed in subpixel SPγ.

Regarding the partition 6 between subpixel SPα and subpixel SPβ, immediately above the upper portion 62, the second organic layer OR12, the second upper electrode UE12, the second cap layer CP12 and the sealing layer SE10 remain on the subpixel SPα side, and the second organic layer OR12, the second upper electrode UE12, the second cap layer CP12 and the sealing layer SE10 are removed on the subpixel SPβ side. Thus, the subpixel SPβ side of the partition 6 is exposed.

The partition 6 located between subpixel SPβ and subpixel SPγ is also exposed.

Subsequently, in step ST24, as shown in FIG. 22, the resist 41 is removed. Thus, the sealing layer SE10 of subpixel SPα is exposed. Through these steps ST21 to ST24, the display element 21 is formed in subpixel SPα. The display element 21 consists of the lower electrode LEα, the first organic layer OR11 including the light emitting layer EMα, the first upper electrode UE11 and the first cap layer CP11. The display element 21 is covered with the sealing layer SE10.

A stacked layer body of the second organic layer OR12 including the light emitting layer EMα, the second upper electrode UE12 and the second cap layer CP12 is formed on the partition 6 between subpixel SPα and subpixel SPβ. This stacked layer body is covered with the sealing layer SE10. Of the partition 6, the portion on the subpixel SPα side is covered with the sealing layer SE10.

In the present embodiment, of the rib 5, the lower layer portion which covers the lower electrode LE is formed so as to have a high resistance to the dry etching in the process of forming the rib 5. Thus, the end portions of the lower electrode LE are assuredly covered with the rib 5. In addition, the formation of an undesired cavity between the lower electrode LE and the rib 5 is prevented. This configuration also prevents the formation of a penetration path for moisture along the boundary surface between the lower electrode LE and the rib 5.

In this way, the reduction in reliability can be prevented.

The subpixel SPα of the above example is one of the subpixels SP1, SP2 and SP3 shown in FIG. 2. For example, when subpixel SPα corresponds to subpixel SP1, the following relationships are applied. The lower electrode LEα corresponds to the lower electrode LE1. The first organic layer OR11 corresponds to the first portion OR1a. The second organic layer OR12 corresponds to the second portion OR1b. The light emitting layer EMα corresponds to the light emitting layer EM1. The first upper electrode UE11 corresponds to the first portion UE1a. The second upper electrode UE12 corresponds to the second portion UE1b. The first cap layer CP11 corresponds to the first portion CP1a. The second cap layer CP12 corresponds to the second portion CP1b. The sealing layer SE10 corresponds to the sealing layer SE1.

As explained above, the present embodiment can provide a display device which can prevent the reduction in reliability and have an improved manufacturing yield and a manufacturing method thereof.

All of the display devices and manufacturing methods thereof that can be implemented by a person of ordinary skill in the art through arbitrary design changes to the display device and manufacturing method thereof described above as the embodiment of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiment by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiment and are self-explanatory from the descriptions of the specification or can be arbitrarily conceived by a person of ordinary skill in the art are considered as the effects of the present invention as a matter of course.

What is claimed is:

1. A manufacturing method of a display device, the method comprising:
   forming a lower electrode above a substrate;
   providing a processing substrate in which the lower electrode is formed, on a stage inside a chamber, forming a first insulating layer overlapping the lower electrode in a state where a first distance is formed between the stage and a counter-electrode, and subsequently forming a second insulating layer on the first insulating layer in a state where a second distance greater than the first distance is formed between the stage and the counter-electrode;
   forming a rib comprising an aperture overlapping the lower electrode by patterning the first insulating layer and the second insulating layer;
   forming a partition comprising a lower portion located on the rib, and an upper portion located on the lower portion and protruding from a side surface of the lower portion;
   forming an organic layer including a first organic layer located on the lower electrode and spaced apart from the lower portion of the partition, and a second organic layer located on the upper portion, the first and second organic layers including light emitting layers formed of a same material;

forming an upper electrode including a first upper electrode which is located on the first organic layer and is in contact with the lower portion of the partition, and a second upper electrode located on the second organic layer;

forming a cap layer including a first cap layer located on the first upper electrode, and a second cap layer located on the second upper electrode; and forming a sealing layer which covers the first cap layer and the second cap layer.

2. The manufacturing method of claim 1, wherein
a pressure inside the chamber in the state where the second distance is formed is higher than the pressure inside the chamber in the state where the first distance is formed.

3. The manufacturing method of claim 1, wherein
the state in which the first distance is formed is maintained for five seconds or more.

4. The manufacturing method of claim 1, wherein
the first distance is changed to the second distance in a state where a reactant gas is introduced into the chamber and voltage is applied to the counter-electrode.

5. The manufacturing method of claim 1, wherein
the first insulating layer and the second insulating layer are formed of silicon nitride.

6. The manufacturing method of claim 5, wherein
the sealing layer is formed of silicon nitride.

7. The manufacturing method of claim 6,
further forming a resist on the sealing layer, and
performing dry etching using the resist as a mask to remove part of the sealing layer immediately above the upper portion.

8. The manufacturing method of claim 7,
further performing etching using the resist as a mask to remove part of the second cap layer, part of the second upper electrode and part of the second organic layer.

9. The manufacturing method of claim 1, wherein
a thickness of the rib is greater than or equal to 200 nm but less than or equal to 400 nm.

10. A manufacturing method of a display device, the method comprising:

forming a lower electrode above a substrate;

providing a processing substrate in which the lower electrode is formed, on a stage inside a chamber, applying voltage to a counter-electrode facing the stage, introducing a reactant gas into the chamber after an elapse of a predetermined time, and forming an insulating layer overlapping the lower electrode;

forming a rib comprising an aperture overlapping the lower electrode by patterning the insulating layer;

forming a partition comprising a lower portion located on the rib, and an upper portion located on the lower portion and protruding from a side surface of the lower portion;

forming an organic layer including a first organic layer located on the lower electrode and spaced apart from the lower portion of the partition, and a second organic layer located on the upper portion, the first and second organic layers including light emitting layers formed of a same material;

forming an upper electrode including a first upper electrode which is located on the first organic layer and is in contact with the lower portion of the partition, and a second upper electrode located on the second organic layer;

forming a cap layer including a first cap layer located on the first upper electrode, and a second cap layer located on the second upper electrode; and forming a sealing layer which covers the first cap layer and the second cap layer.

11. The manufacturing method of claim 10, wherein
a time from start of application of voltage to the counter-electrode to start of introduction of the reactant gas is greater than or equal to five seconds.

12. The manufacturing method of claim 10, wherein
the insulating layer is formed of silicon nitride.

13. The manufacturing method of claim 12, wherein
the sealing layer is formed of silicon nitride.

14. The manufacturing method of claim 13,
further forming a resist on the sealing layer, and
performing dry etching using the resist as a mask to remove part of the sealing layer immediately above the upper portion.

15. The manufacturing method of claim 14,
further performing etching using the resist as a mask to remove part of the second cap layer, part of the second upper electrode and part of the second organic layer.

16. The manufacturing method of claim 15, wherein
a thickness of the rib is greater than or equal to 200 nm but less than or equal to 400 nm.

* * * * *